(12) United States Patent
Nakazono et al.

(10) Patent No.: US 11,912,897 B2
(45) Date of Patent: Feb. 27, 2024

(54) ELECTROCONDUCTIVE COATING MATERIAL AND METHOD FOR PRODUCING SHIELDED PACKAGE USING SAID ELECTROCONDUCTIVE COATING MATERIAL

(71) Applicant: Tatsuta Electric Wire & Cable Co., Ltd., Osaka (JP)

(72) Inventors: Hajime Nakazono, Kyoto (JP); Kazuhiro Matsuda, Kyoto (JP)

(73) Assignee: Tatsuta Electric Wire & Cable Co., Ltd., Osaka (JP)

( * ) Notice: Subject to any disclaimer, the term of this patent is extended or adjusted under 35 U.S.C. 154(b) by 800 days.

(21) Appl. No.: 17/044,146

(22) PCT Filed: Feb. 18, 2019

(86) PCT No.: PCT/JP2019/005743
§ 371 (c)(1),
(2) Date: Sep. 30, 2020

(87) PCT Pub. No.: WO2019/198336
PCT Pub. Date: Oct. 17, 2019

(65) Prior Publication Data
US 2021/0024758 A1    Jan. 28, 2021

(30) Foreign Application Priority Data
Apr. 10, 2018  (JP) ................... 2018-075422

(51) Int. Cl.
*C09D 5/24*    (2006.01)
*C09D 7/61*    (2018.01)
(Continued)

(52) U.S. Cl.
CPC ............ *C09D 5/24* (2013.01); *C08G 59/4028* (2013.01); *C08K 3/08* (2013.01); *C08K 5/0091* (2013.01);
(Continued)

(58) Field of Classification Search
None
See application file for complete search history.

(56) References Cited

U.S. PATENT DOCUMENTS

2011/0006106 A1* 1/2011 Kanryo ................ H01L 25/165
228/170
2016/0039968 A1   2/2016 Rukavina

FOREIGN PATENT DOCUMENTS

CN    101654581 A    2/2010
CN    105609162 A    5/2016
(Continued)

OTHER PUBLICATIONS

International Search Report dated May 14, 2019 for International Patent Application No. PCT/JP2019/005743.

*Primary Examiner* — Katie L. Hammer
(74) *Attorney, Agent, or Firm* — United IP Counselors, LLC; Kenneth M. Fagin

(57) ABSTRACT

The present invention provides a conductive coating material curable at low temperatures. The present invention relates to a conductive coating material containing: 100 parts by weight of an epoxy resin-containing binder component (A); 500 to 2500 parts by weight of metal particles (B); 1 to 150 parts by weight of a curing agent (C); 20 to 800 parts by weight of a solvent (D); and 0.5 to 5 parts by weight of a curing catalyst (E).

7 Claims, 3 Drawing Sheets

(51) Int. Cl.
*C08K 3/08* (2006.01)
*C08K 5/00* (2006.01)
*C09D 163/00* (2006.01)
*H01L 21/56* (2006.01)
*H01L 21/78* (2006.01)
*H01L 23/552* (2006.01)
*H01B 1/22* (2006.01)
*H05K 9/00* (2006.01)
*C09D 7/20* (2018.01)
*C08G 59/40* (2006.01)
*C08K 5/56* (2006.01)
*H01L 23/31* (2006.01)

(52) U.S. Cl.
CPC .................. *C08K 5/56* (2013.01); *C09D 7/20* (2018.01); *C09D 7/61* (2018.01); *C09D 163/00* (2013.01); *H01B 1/22* (2013.01); *H01L 21/56* (2013.01); *H01L 21/78* (2013.01); *H01L 23/552* (2013.01); *H05K 9/00* (2013.01); *H05K 9/0075* (2013.01); *C08K 2003/085* (2013.01); *C08K 2003/0806* (2013.01); *H01L 23/3121* (2013.01)

(56) References Cited

FOREIGN PATENT DOCUMENTS

| | | |
|---|---|---|
| EP | 3650499 A1 | 5/2020 |
| JP | S5765765 A | 4/1982 |
| JP | S604562 A | 1/1985 |
| JP | S6071641 A | 4/1985 |
| JP | 2004355933 A | 12/2004 |
| JP | 2005187753 A | 7/2005 |
| JP | 2005294254 A | 10/2005 |
| JP | 2007265802 A | 10/2007 |
| JP | 2008042152 A | 2/2008 |
| JP | 2009062523 A | 3/2009 |
| JP | 2012193320 A | 10/2012 |
| JP | 2016100134 A | 5/2016 |
| JP | 2016183335 A | 10/2016 |
| JP | 2018009112 A | 1/2018 |
| WO | 2007137581 A1 | 12/2007 |
| WO | 2016052664 A1 | 4/2016 |
| WO | 2017023747 A1 | 2/2017 |
| WO | 2019009124 A1 | 1/2019 |

* cited by examiner (a)

(b)

(a)

(b)

(c)

ELECTROCONDUCTIVE COATING MATERIAL AND METHOD FOR PRODUCING SHIELDED PACKAGE USING SAID ELECTROCONDUCTIVE COATING MATERIAL

CROSS-REFERENCE TO RELATED APPLICATIONS

This application is the U.S. National Phase of PCT application PCT/JP2019/005743 filed Feb. 18, 2019, the contents of which are incorporated herein by reference in their entirety. The PCT application, in turn, claims the priority benefit of Japanese application JP 2018-075422 filed Apr. 10, 2018, the contents of which are incorporated herein by reference in their entirety.

TECHNICAL FIELD

The present invention relates to a conductive coating material and a method of producing a shield package using the conductive coating material.

BACKGROUND ART

Nowadays, electronic devices such as mobile phones and tablet terminals include many electronic components mounted thereon for wireless communication to transmit a large amount of data. Such electronic components for wireless communication are not only likely to generate noise but are also sensitive to noise, and are thus likely to cause a malfunction when exposed to external noise.

In addition, there is a demand to increase the mounting density of electronic components in order to provide smaller and lighter electronic devices with higher functionality. Yet, an increase in mounting density not only increases the number of electronic components that cause noise but also increases the number of electronic components affected by noise.

Conventionally known techniques include a shield package in which a whole package containing an electronic component that causes noise is covered with a shielding layer to prevent generation of noise from the electronic component and to prevent intrusion of noise.

Patent Literature 1 discloses a conductive coating material for forming such a shielding layer, specifically discloses a conductive coating material containing at least (A) 100 parts by mass of a binder component containing 5 to 30 parts by mass of solid epoxy resin which is solid at room temperature and 20 to 90 parts by mass of liquid epoxy resin which is liquid at room temperature in an amount not exceeding 100 parts by mass in total, (B) 500 to 1800 parts by mass of metal particles, and (C) 0.3 to 40 parts by mass of a curing agent, the metal particles containing (a) spherical metal particles and (b) flaky metal particles, the weight ratio of (a) the spherical metal particles to (b) the flaky metal particles ((a):(b)) being 25:75 to 75:25, the conductive coating material having a viscosity at a liquid temperature of 25° C. of 100 to 600 mPa·s when measured with a cone-plate rotary viscometer at a rotation speed of 0.5 rpm.

CITATION LIST

Patent Literature

Patent Literature 1: JP 2018-9112 A

SUMMARY OF INVENTION

Technical Problem

Use of such a conductive coating material enables the formation of a shielding layer on electronic components.

An example of a conventional method of forming a shielding layer on electronic components is a method including mounting electronic components on a substrate, sealing the electronic components with a sealing material, applying a conductive coating material, and heating the conductive coating material to cure the conductive coating material to form a shielding layer.

In such a method, the conductive coating material described in Patent Literature 1 may be used to form a shielding layer.

However, the conductive coating material described in Patent Literature 1 has a high curing temperature and thus needs to be cured at high temperatures.

In this case, the electronic components may be damaged by heat applied during curing of the conductive coating material.

The present invention has been made to solve the above problems and aims to provide a conductive coating material curable at low temperatures.

Solution to Problem

That is, the present invention relates to a conductive coating material containing:

100 parts by weight of an epoxy resin-containing binder component (A);
500 to 2500 parts by weight of metal particles (B);
1 to 150 parts by weight of a curing agent (C);
20 to 800 parts by weight of a solvent (D); and
0.5 to 5 parts by weight of a curing catalyst (E).

The conductive coating material of the present invention containing the epoxy resin-containing binder component (A), the metal particles (B), the curing agent (C), and the solvent (D) in the above-described proportions, when cured, can be formed into a shielding layer having good shielding performance. The conductive coating material can also be applied to electronic components with good application stability.

The conductive coating material of the present invention containing the curing catalyst (E) has a lower curing temperature.

Preferably, in the conductive coating material of the present invention, the metal particles (B) are at least one selected from the group consisting of silver powder, silver-coated copper powder, and silver-coated copper alloy powder.

These metal particles have high conductivity. Thus, they impart sufficient conductivity to a shielding layer obtained by curing the conductive coating material of the present invention.

Preferably, in the conductive coating material of the present invention, the curing agent (C) is an isocyanate curing agent.

Use of an isocyanate curing agent enables sufficient curing of the epoxy resin-containing binder component (A).

In the industrial production of shield packages, the conductive coating material is charged in a coater and mechanically applied to an object.

In the application of the conductive coating material contained in a coater, if the conductive coating material has properties (e.g., viscosity) deteriorated over time, it tends to cause problems such as clogging of the coater over time.

For this reason, the conductive coating material preferably has high storage stability.

The conductive coating material of the present invention containing an isocyanate curing agent as the curing agent (C) has enhanced storage stability.

Preferably, in the conductive coating material of the present invention, the curing catalyst (E) is an organic metal compound, and the organic metal compound is at least one selected from the group consisting of iron-2-ethylhexanoate, iron(III) acetylacetonate, zinc 2-ethylhexanoate, zinc naphthenate, and zinc(II) acetylacetonate.

Use of any of these compounds can suitably provide a conductive coating material having a lower curing temperature.

Preferably, the conductive coating material of the present invention is used for a shield package.

Use of the conductive coating material of the present invention can reduce the damage of the electronic components in the shield package caused by heat applied during production.

The present invention relates to a method of producing a shield package that includes: a package containing electronic components mounted on a substrate and a sealing material sealing the electronic components; and a shielding layer covering the package, the method including:

a package forming step of preparing the package containing electronic components sealed therein, including mounting the electronic components on the substrate, applying the sealing material to the substrate, and curing the sealing material;

a conductive coating material applying step of applying the conductive coating material of the present invention to the substrate with the package formed thereon;

a shielding layer forming step of forming the shielding layer, including heating the substrate with the conductive coating material applied thereto to cure the conductive coating material; and a cutting step of cutting the substrate so that the package is separated into individual pieces.

As described above, the conductive coating material of the present invention has a lower curing temperature. This can reduce the damage of electronic components from heat in the shielding layer forming step.

In addition, the heating temperature does not have to be high, which can reduce the costs of heating.

Preferably, the method of producing a shield package of the present invention further includes after the package forming step, a package partitioning step of partitioning the package on the substrate with grooves, the step including forming the grooves by carving the sealing material between the electronic components, wherein in the cutting step, the substrate is cut along the grooves.

The formation of grooves can easily achieve separation of the package into individual pieces.

Preferably, in the method of producing a shield package of the present invention, the heating in the shielding layer forming step is performed at a temperature of 120° C. to 150° C.

The conductive coating material of the present invention sufficiently cures even at such a low heating temperature.

Advantageous Effects of Invention

The conductive coating material of the present invention containing the curing catalyst (E) has a lower curing temperature.

DESCRIPTION OF EMBODIMENTS

Figure 1:
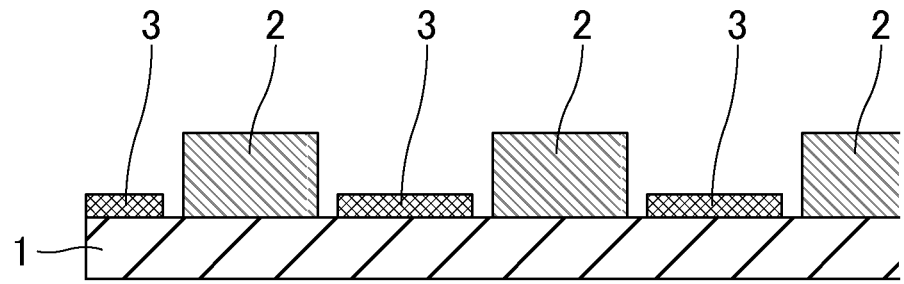
FIGS. 1(a) and 1(b) are views schematically showing an example of the package forming step of the method of producing a shield package of the present invention.
Figure 1:
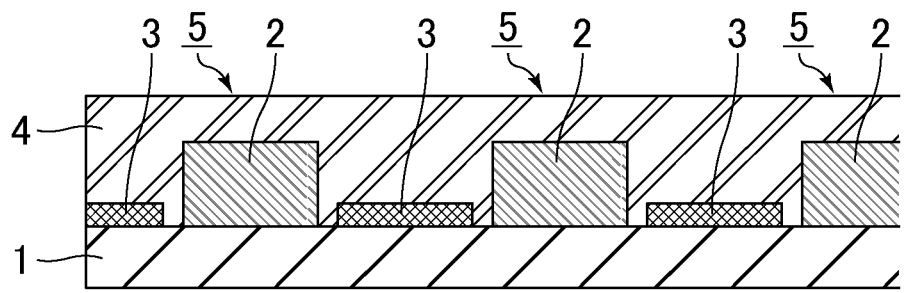

The following specifically describes the conductive coating material of the present invention. Yet, the present invention is not limited to the following embodiments, and changes and modifications may be made without departing from the gist of the present invention.

The conductive coating material of the present invention contains 100 parts by weight of an epoxy resin-containing binder component (A), 500 to 2500 parts by weight of metal particles (B), 1 to 150 parts by weight of a curing agent (C), 20 to 800 parts by weight of a solvent (D), and 0.5 to 5 parts by weight of a curing catalyst (E).

The conductive coating material of the present invention containing the epoxy resin-containing binder component (A), the metal particles (B), the curing agent (C), and the solvent (D) in the above-described proportions, when cured, can be formed into a shielding layer having good shielding performance. The conductive coating material can also be applied to electronic components with good application stability.

Further, the conductive coating material of the present invention containing the curing catalyst (E) has a lower curing temperature.

The following specifically describes the elements of the conductive coating material of the present invention.

(Epoxy Resin-Containing Binder Component)

The binder component (A) in the conductive coating material of the present invention contains an epoxy resin as an essential component.

The epoxy resin is preferably present in the binder component (A) in a proportion by weight of 5 to 95% by weight, more preferably 30 to 90% by weight.

The epoxy resin preferably contains both an epoxy resin which is solid at room temperature and an epoxy resin which is liquid at room temperature.

The epoxy resin which is solid at room temperature is preferably present in the binder component (A) in a proportion by weight of 5 to 30% by weight, more preferably 5 to 20% by weight.

The epoxy resin which is liquid at room temperature is preferably present in the binder component (A) in a proportion by weight of 20 to 90% by weight, more preferably 25 to 80% by weight.

The "solid at room temperature" herein means a non-fluid state in the absence of solvent at 25° C.

The "liquid at room temperature" herein means a fluid state in the absence of solvent at 25° C.

Use of an epoxy resin which is solid at room temperature can provide a conductive coating material which can be uniformly applied to a surface of the package and can be formed into a shielding layer without unevenness. The epoxy resin which is solid at room temperature preferably contains two or more glycidyl groups in a molecule and has an epoxy equivalent of 150 to 280 g/eq. With an epoxy equivalent of 150 g/eq or more, problems such as cracks and warpage are less likely to occur. With an epoxy equivalent of 280 g/eq or less, a cured product having much better heat resistance is easily obtained.

Non-limiting examples of the epoxy resin which is solid at room temperature include bisphenol-type epoxy resins such as a bisphenol A-type epoxy resin, a bisphenol F-type epoxy resin, and a bisphenol S-type epoxy resin; a spirocyclic epoxy resin; a naphthalene-type epoxy resin; a biphenyl-type epoxy resin; a terpene-type epoxy resin; glycidyl ether-type epoxy resins such as tris(glycidyloxyphenyl)methane and tetrakis(glycidyloxyphenyl)ethane; glycidyl amine-type epoxy resins such as tetraglycidyldiaminodiphenylmethane; a tetrabromobisphenol A-type epoxy resin; novolac-type epoxy resins such as a cresol novolak-type epoxy resin, a phenol novolak-type epoxy resin, an a-naphthol novolac-type epoxy resin, and a brominated phenol novolak-type epoxy resin; and a rubber-modified epoxy resin.

These may be used alone or two or more of these may be used in combination.

The epoxy resin which is solid at room temperature may be dissolved in the below-described solvent (D) when used.

When the epoxy resin is an epoxy resin which is liquid at room temperature, the epoxy resin which is liquid at room temperature preferably contains both a liquid glycidyl amine epoxy resin and a liquid glycidyl ether epoxy resin.

In this case, the liquid glycidyl amine epoxy resin is preferably present in the binder component (A) in a proportion by weight of 5 to 35% by weight, and the liquid glycidyl ether epoxy resin is preferably present in the binder component (A) in a proportion by weight of 20 to 55% by weight.

The binder component (A) containing a liquid glycidyl amine epoxy resin and a liquid glycidyl ether epoxy resin in the above-described proportions can provide a conductive coating material in which the conductivity and the adhesiveness are well balanced. Further, a cured product after curing with much less warpage can be obtained, and a shield package having much better heat resistance can be obtained.

The liquid glycidyl amine epoxy resin preferably has an epoxy equivalent of 80 to 120 g/eq. The liquid glycidyl amine epoxy resin also preferably has a viscosity of 1.5 Pa·s or lower, more preferably 0.5 to 1.5 Pa·s.

The liquid glycidyl ether epoxy resin preferably has an epoxy equivalent of 180 to 220 g/eq. The liquid glycidyl ether epoxy resin preferably has a viscosity of 6 Pa·s or lower, more preferably 1 to 6 Pa·s.

When the binder component (A) contains the liquid glycidyl amine epoxy resin and the liquid glycidyl ether epoxy resin having the above-described epoxy equivalents and the viscosities, a cured product after curing with much less warpage can be obtained, and a shield package having much better heat resistance and including a cured product having a more uniform thickness can be obtained.

Herein, the viscosities of the liquid glycidyl amine epoxy resin and liquid glycidyl ether epoxy resin mean the values determined at a liquid temperature of 25° C. with a BH-type viscometer (rotor No. 5, rotation speed of 10 rpm).

In the conductive coating material of the present invention, the binder component (A) may further contain a (meth)acrylate compound.

The (meth)acrylate compound refers to an acrylate compound or a methacrylate compound, and may be any compound having an acryloyl group or a methacryloyl group. Examples of the (meth)acrylate compound include isoamyl acrylate, neopentyl glycol diacrylate, trimethylolpropane triacrylate, ditrimethylolpropane tetraacrylate, 2-hydroxy-3-acryloyloxypropyl methacrylate, a phenyl glycidyl ether acrylate hexamethylene diisocyanate urethane prepolymer, a bisphenol A diglycidyl ether acrylic acid adduct, ethylene glycol dimethacrylate, and diethylene glycol dimethacrylate.

These may be used alone or two or more of these may be used in combination.

When the binder component (A) contains a (meth)acrylate compound, the proportion by weight of the (meth)acrylate compound is preferably 5 to 95% by weight, more preferably 20 to 80% by weight relative to the sum of the weights of the epoxy resin and the (meth)acrylate compound.

When the proportion by weight of the (meth)acrylate compound is 5% by weight or more relative to the sum of the weights of the epoxy resin and the (meth)acrylate compound, the conductive coating material has good storage stability, can be rapidly cured, and can be prevented from dripping during curing.

When the proportion by weight of the (meth)acrylate compound is 95% by weight or less relative to the sum of the weights of the epoxy resin and the (meth)acrylate compound, the adhesion between the package and the shielding layer is likely to be better.

The binder component (A) may further contain a modifier such as alkyd resin, melamine resin, or xylene resin in order to enhance the properties of the conductive coating material.

When the binder component (A) contains a modifier, the modifier is preferably present in the binder component (A) in a proportion by weight of 40% by weight or less, more preferably 10% by weight or less.

(Metal Particles)

The metal particles (B) in the conductive coating material of the present invention may be any conductive particles, and examples thereof include copper powder, silver powder, nickel powder, silver-coated copper powder, gold-coated copper powder, silver-coated nickel powder, gold-coated nickel powder, and silver-coated copper alloy powder. In particular, the metal particles (B) are preferably at least one selected from the group consisting of silver powder, silver-coated copper powder, and silver-coated copper alloy powder.

These metal particles have high conductivity. Thus, they impart sufficient conductivity to a shielding layer obtained by curing the conductive coating material of the present invention.

The metal particles may be in any shape such as a spherical, flaky (scale-like), dendritic, or fibrous shape.

"Spherical" metal particles include not only substantially true spherical particles (atomized powder), but also substantially spherical particles such as substantially polyhedral spherical particles (reduced powder) and amorphous particles (electrolysis powder).

The metal particles preferably have an average particle size of 1 to 30 μm.

When the metal particles have an average particle size of 1 μm or greater, they are well dispersed and prevented from aggregating. The metal particles are also resistant to oxidation.

When the metal particles have an average particle size of 30 μm or smaller, a shielding layer obtained by curing the conductive coating material of the present invention has good connection with the ground circuit of the package.

The "average particle size of metal particles" herein means an average particle size $D_{50}$ (median diameter) based on the number of particles, determined by a laser diffraction/scattering method.

The metal particles (B) are present in the conductive coating material of the present invention in an amount of 500 to 2500 parts by weight per 100 parts by weight of the binder component (A).

The metal particles (B) are preferably present in the conductive coating material of the present invention in an amount of 600 to 2400 parts by weight, more preferably 1000 to 2000 parts by weight per 100 parts by weight of the binder component (A).

When the metal particles (B) are present in an amount of 500 parts by weight or more per 100 parts by weight of the binder component (A), a shielding layer obtained by curing the conductive coating material has good conductivity.

When the metal particles (B) are present in an amount of 2500 parts by weight or less per 100 parts by weight of the binder component (A), a shielding layer obtained by curing the conductive coating material has good adhesion with the package. Further, the shielding layer is resistant to chipping. Thus, the shielding layer is less likely to be chipped even when it is cut with a dicing saw or the like.

The conductive coating material also has good application stability.

When the metal particles have a flaky shape, they preferably have a tap density of 4.0 to 6.0 g/cm³. With the tap density within the above range, a shielding layer formed by curing the conductive coating material has good conductivity.

When the metal particles have a flaky shape, each particle preferably has an aspect ratio of 5 to 20, more preferably 5 to 10.

With the aspect ratio within the above range, a shielding layer formed by curing the conductive coating material has better conductivity.

(Curing Agent)

The curing agent (C) in the conductive coating material of the present invention may be any curing agent capable of curing the binder component (A). Examples of the curing agent include an isocyanate curing agent, a phenol curing agent, an imidazole curing agent, an amine curing agent, a cation curing agent, and a radical curing agent.

Use of any of these curing agents enables sufficient curing of the epoxy resin-containing binder component (A).

Preferred among these is an isocyanate curing agent.

In the industrial production of shield packages, the conductive coating material is charged in a coater and mechanically applied to an object.

In the application of the conductive coating material contained in a coater, if the conductive coating material has properties (e.g., viscosity) deteriorated over time, it tends to cause problems such as clogging of the coater over time.

For this reason, the conductive coating material preferably has high storage stability.

The conductive coating material of the present invention containing an isocyanate curing agent as the curing agent (C) has enhanced storage stability.

Examples of the isocyanate curing agent include a polyisocyanate compound and a blocked isocyanate compound.

Examples of the phenol curing agent include novolac phenol and a naphthol compound.

Examples of the imidazole curing agent include imidazole, 2-undecylimidazole, 2-heptadecylimidazole, 2-methylimidazole, 2-ethylimidazole, 2-phenylimidazole, 2-ethyl-4-methyl-imidazole, 1-cyanoethyl-2-undecylimidazole, and 2-phenylimidazole.

Examples of the cationic curing agent include onium compounds such as amine salts of boron trifluoride, p-methoxybenzene diazonium hexafluorophosphate, diphenyliodonium hexafluorophosphate, triphenylsulfonium, tetra-n-butylphosphonium tetraphenylborate, and tetra-n-butylphosphonium-o, o-diethylphosphorodithioate.

Examples of the radical curing agent include di-cumyl peroxide, t-butyl cumyl peroxide, t-butyl hydroperoxide, and cumene hydroperoxide.

The curing agent (C) is present in the conductive coating material of the present invention in an amount of 1 to 150 parts by weight per 100 parts by weight of the binder component (A).

The curing agent (C) is preferably present in the conductive coating material of the present invention in an amount of 2 to 145 parts by weight, more preferably 5 to 140 parts by weight per 100 parts by weight of the binder component (A).

When the curing agent (C) is present in an amount of 1 part by weight or more per 100 parts by weight of the binder component (A), a shielding layer formed using the conductive coating material of the present invention has good adhesion with a surface of the package. The shielding layer also has good conductivity. As a result, a shielding layer having good shielding effects is easily obtained.

When the curing agent (C) is present in an amount of 150 parts by weight or less per 100 parts by weight of the binder component (A), the storage stability of the conductive coating material is enhanced. Further, the specific resistance value of a cured product of the conductive coating material can be reduced.

(Solvent)

The solvent (D) is present in the conductive coating material of the present invention in an amount of 20 to 800 parts by weight per 100 parts by weight of the binder component (A).

Non-limiting examples of the solvent (D) include methyl ethyl ketone, acetone, acetophenone, methyl cellosolve, methyl cellosolve acetate, methyl carbitol, diethylene glycol dimethyl ether, tetrahydrofuran, methyl acetate, 1-methoxy-2-propanol, and 3-methoxy-3-methyl-1-butyl acetate.

These may be used alone or two or more of these may be used in combination.

(Curing Catalyst)

The curing catalyst (E) contained in the conductive coating material of the present invention may be any curing catalyst capable lowering the curing temperature of the binder component (A).

Examples of the curing catalyst (E) include an organic metal compound. The organic metal compound is preferably a Fe-based curing catalyst and/or a Zn-based curing catalyst.

More preferred among these is at least one selected from the group consisting of iron-2-ethylhexanoate, iron(III) acetylacetonate, zinc 2-ethylhexanoate, zinc naphthenate, and Zinc(II) acetylacetonate.

Use of any of these compounds can suitably provide a conductive coating material having a lower curing temperature.

The curing catalyst (E) is present in the conductive coating material of the present invention in an amount of 0.5 to 5 parts by weight per 100 parts by weight of the binder component (A).

The curing catalyst (E) is preferably present in the conductive coating material of the present invention in an amount of 0.6 to 4.8 parts by weight, more preferably 1.0 to 4.5 parts by weight per 100 parts by weight of the binder component (A).

When the curing catalyst (E) is present in an amount of 0.5 parts by weight or more per 100 parts by weight of the binder component (A), the binder component (A) is suitably cured at lower temperatures. Further, a shielding layer having good conductivity is obtained. As a result, a shielding layer having good shielding effects is easily obtained.

When the curing catalyst (E) is present in an amount of 5 parts by weight or less per 100 parts by weight of the binder component (A), a shielding layer formed using the conductive coating material of the present invention has good adhesion with a surface of the package. Further, the conductive coating material has enhanced storage stability.

(Different Additive)

The conductive coating material of the present invention may contain known additives such as defoamers, thickeners, adhesives, fillers, flame retardants, and colorants, as long as they will not impair the object of the present invention.

The conductive coating material of the present invention preferably has a viscosity at a liquid temperature of 25° C. of 50 to 600 mPa·s, more preferably 60 to 550 mPa·s, still more preferably 100 to 500 mPa·s.

When the conductive coating material has a viscosity of 50 mPa·s or higher, the conductive coating material can be cured without dripping on a wall surface of the package so that a shielding layer without unevenness can be formed. Further, the metal particles can be prevented from precipitating.

When the conductive coating material has a viscosity of 600 mPa·s or lower, the conductive coating material does not clog a spray nozzle when it is sprayed. Thereby, the shielding layer is easily formed without unevenness on a surface and a side wall face of the package.

The "viscosity of the conductive coating material" means a viscosity measured with a cone-plate rotary viscometer at a rotation speed of 10 rpm.

The following describes a method of producing a shield package using the conductive coating material of the present invention. This method of producing a shield package is also the method of producing a shield package of the present invention.

An example of the below-described method of producing a shield package of the present invention includes a package forming step (1), a package partitioning step (2), a conductive coating material applying step (3), a shielding layer forming step (4), and a cutting step (5).

In the method of producing a shield package of the present invention, the package partitioning step (2) is not an essential step and may be omitted.

The steps are described with reference to the drawings.

FIGS. 1(a) and 1(b) are views schematically showing an example of the package forming step of the method of producing a shield package of the present invention.

Figure 2:
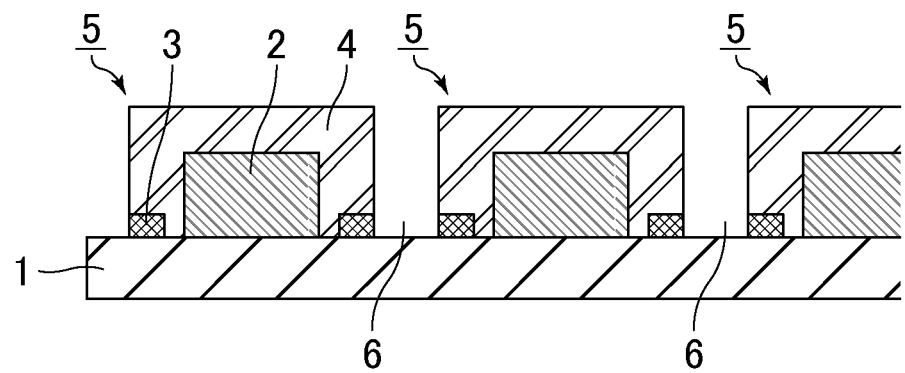
FIG. 2 is a view schematically showing an example of the package partitioning step of the method of producing a shield package of the present invention.

FIG. 2 is a view schematically showing an example of the package partitioning step of the method of producing a shield package of the present invention.

Figure 3:
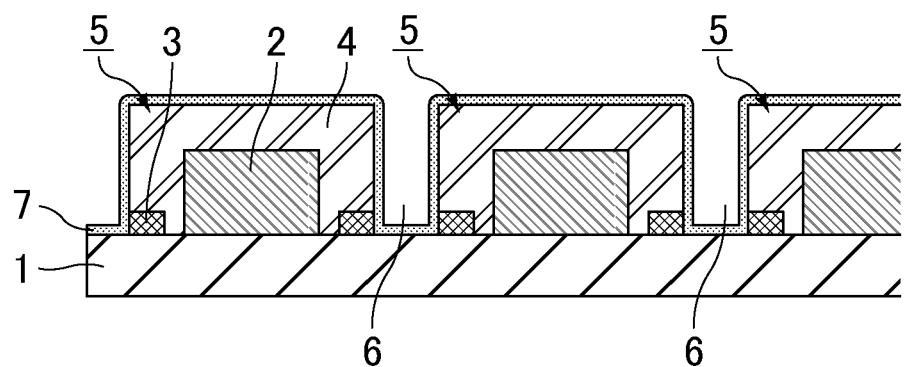
FIG. 3 is a view schematically showing an example of the conductive coating material applying step of the method of producing a shield package of the present invention.

FIG. 3 is a view schematically showing an example of the conductive coating material applying step of the method of producing a shield package of the present invention.

Figure 4:
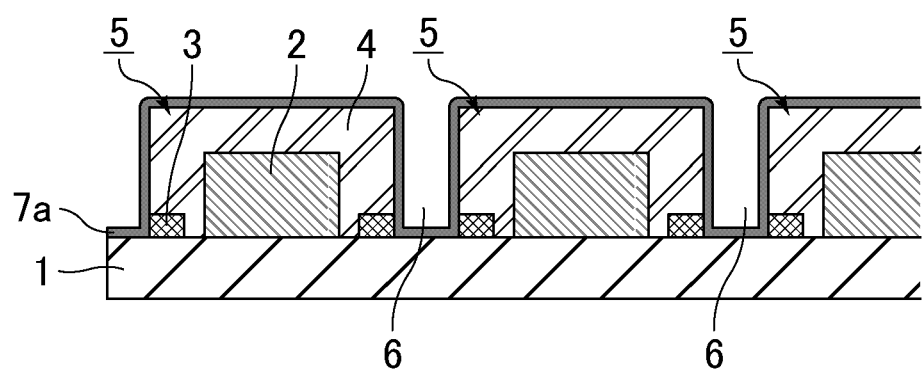
FIG. 4 is a view schematically showing an example of the shielding layer forming step of the method of producing a shield package of the present invention.

FIG. 4 is a view schematically showing an example of the shielding layer forming step of the method of producing a shield package of the present invention.

Figure 5:
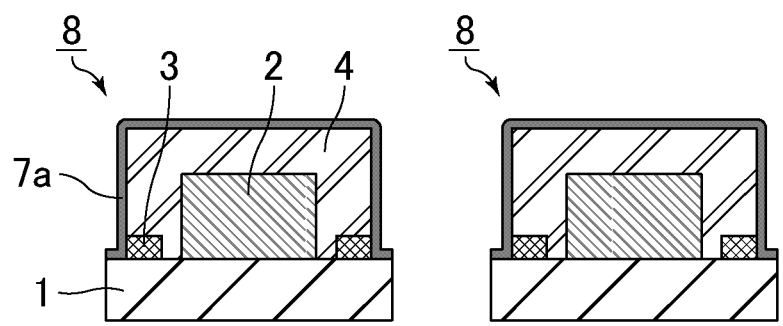
FIG. 5 is a view schematically showing an example of the cutting step of the method of producing a shield package of the present invention.

FIG. 5 is a view schematically showing an example of the cutting step of the method of producing a shield package of the present invention.

(1) Package Forming Step

First, as shown in FIG. 1(a), a substrate 1 including multiple electronic components 2 and ground circuit patterns 3 each placed between the electronic components 2 is prepared.

Then, as shown in FIG. 1(b), a sealing material 4 is applied to the electronic components 2 and the ground circuit patterns 3 and cured to seal the electronic components 2 so that a package 5 is prepared.

Non-limiting examples of the sealing material include metals such as iron and aluminum, resins such as epoxy resin, and ceramics.

(2) Package Partitioning Step

Then, as shown in FIG. 2, the sealing material 4 between the multiple electronic components 2 is carved to form grooves 6.

These grooves 6 partition the package 5 into parts each containing the electronic component 2.

In this case, at least part of each ground circuit pattern 3 is exposed from the wall surfaces defining the grooves 6.

The formation of such grooves 6 easily enables separation of the package 5 into individual pieces as described later.

In the conductive coating material applying step described later, the conductive coating material can be applied also to a side face of the package 5.

(3) Conductive Coating Material Applying Step

Then, as shown in FIG. 3, a conductive coating material 7 is applied to the substrate 1 with the package 5 formed thereon.

The conductive coating material may be applied by any method. For example, it may be applied with a brush or sprayed with a spray gun or the like.

When the conductive coating material 7 is spray-applied, the conditions for spraying such as spray pressure, spray flow rate, and the distance between the spray port of the spray gun and a surface of the package 5 are preferably appropriately set.

(4) Shielding Layer Forming Step

Then, the conductive coating material 7 is dried, and as shown in FIG. 4, the substrate 1 with the conductive coating material 7 applied thereto is heated to cure the conductive coating material 7. Thereby, a shielding layer 7a is formed.

In this step, drying and curing of the conductive coating material 7 may be performed simultaneously or separately.

The heating temperature may be any temperature, preferably 120° C. to 150° C.

The conductive coating material 7, which is the conductive coating material of the present invention, sufficiently cures even at such a low heating temperature.

(5) Cutting Step

As shown in FIG. 5, the substrate 1 is cut along the grooves 6 so that the package 5 is separated into individual pieces.

The substrate 1 may be cut by any method such as using a dicing saw.

Through the above steps, shield packages 8 each including the package 5 and the shielding layer 7a formed thereon can be produced.

As described above, the conductive coating material of the present invention has a lower curing temperature. This can reduce the damage of electronic components from heat.

In addition, the heating temperature does not have to be high, which can reduce the costs of heating.

EXAMPLES

The following describes examples that specifically describe the present invention, but the present invention is not limited to these examples.

Examples 1 to 10 and Comparative Examples 1 to 9

The materials were mixed according to the formulation shown in Tables 1 and 2, attached hereto as an Appendix to the specification, so that conductive coating materials of Examples 1 to 10 and Comparative Examples 1 to 9 were prepared. The values in Tables 1 and 2 are expressed as parts by weight.

In the formulation shown in Tables 1 and 2, the following materials were used.

(Binder Component (A))

A mixture of 40 parts by weight of solid epoxy resin (trade name "JER 157S70" available from Mitsubishi Chemical Corporation), 30 parts by weight of glycidyl amine epoxy resin (trade name "EP-3905S" available from ADEKA Corporation), and 30 parts by weight of glycidyl ether epoxy resin (trade name "EP-4400" available from ADEKA Corporation)

(Metal particles (B))

A mixture of 750 parts by weight of spherical reduced silver powder having an average particle size of 2 μm and 750 parts by weight of flaky silver powder having an average particle size of 5 μm and an aspect ratio of 5

(Curing Agent (C))

Isocyanate curing agent: polyisocyanate compound (trade name "DN-992" available from DIC)

Imidazole curing agent: 2-ethylimidazole (Tokyo Chemical Industry Co., Ltd.)

Radical curing agent: cumene hydroperoxide (Tokyo Chemical Industry Co., Ltd.)

(Solvent (D))

1-Methoxy-2-propanol (Kishida Chemical Co., Ltd.) (Curing catalyst (E))

Fe-based curing catalyst: iron acetylacetonate (Kishida Chemical Co., Ltd.)

Zn-based curing catalyst: zinc 2-ethylhexanoate (Nacalai Tesque, Inc.)

(Evaluation of Curability)

The conductive coating material of each of the examples and comparative examples was applied to a glass plate to a thickness of 20 μm and heated at 120° C. for 60 minutes. Then, the curability of the conductive coating material was evaluated. The evaluation was performed according to the following criteria. The results are shown in Tables 1 and 2.

Good: the conductive coating material was completely cured.

Poor: the conductive coating material was not cured or semi-cured.

(Evaluation of Specific Resistance)

To a glass epoxy substrate was attached a 55 μm-thick polyimide film with a 5 mm-wide slit. Thus, a printing plate was prepared.

The conductive coating material of each of the examples and comparative examples was linearly printed (length: 60 mm, width: 5 mm, thickness: about 100 μm) on the polyimide film and heated at 120° C. for 60 minutes to finally cure the conductive coating material. Thereafter, the polyimide film was peeled to obtain a cured product sample. The resistance R (Ω) of the cured product sample was measured using a tester, and the specific resistance (Ω·cm) was calculated from the following expression (1):

Specific resistance=cross sectional area S/length L×resistance R  (1)

where S (cm$^2$) was the cross sectional area of the cured product sample and L (cm) was the length of the cured product sample.

The results are shown in Tables 1 and 2.

(Evaluation of Acetone Rubbing Resistance)

Cured product samples were prepared using the conductive coating materials of the examples and comparative examples as in the "Evaluation of specific resistance".

A paper towel impregnated with acetone was reciprocated 10 times on each cured product sample. The cured product sample was subjected to measurement of the peeling percentage (%) of the cured product of the conductive coating material using the following expression (2).

Peeling percentage of conductive coating material={1−(area of cured product sample remaining after treatment with paper towel/area of cured product sample before treatment with paper towel)}×100  (2)

This evaluation indicates that the lower the peeling percentage of the cured product of the conductive coating material, the better the conductive coating material is cured.

The results are shown in Tables 1 and 2.

(Evaluation of Application Stability)

Figure 6:
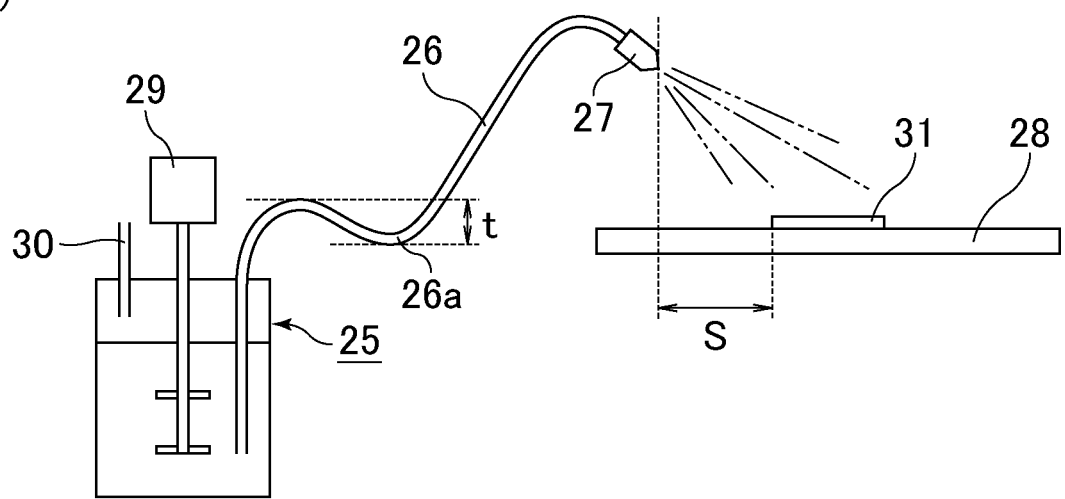
FIGS. 6(a) to 6(c) are views schematically showing a method of evaluating the application stability.
Figure 6:
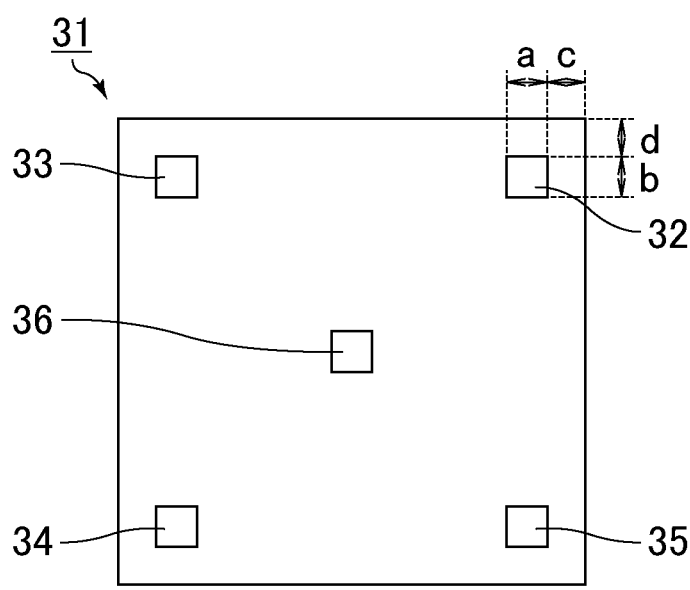
Figure 6:
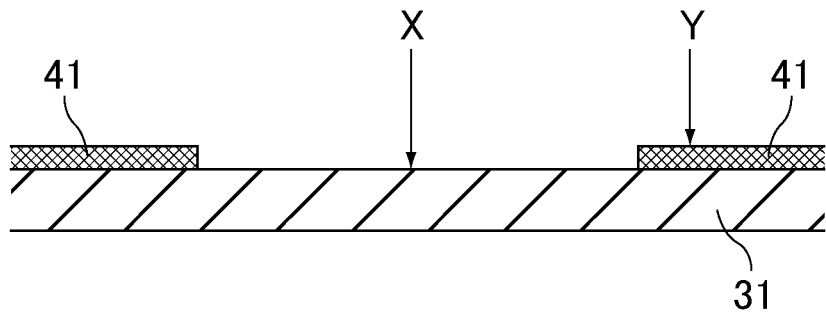

FIGS. 6(a) to 6(c) are views schematically showing a method of evaluating application stability.

The conductive coating material of each of the examples and comparative examples was spray-applied to a square glass epoxy substrate (length: 10 cm×width: 10 cm×thickness: 1 mm) as shown in FIG. 6(b) in the following manner using a coater (Spray Cart III available from Spraying Systems Co., Japan, spray nozzle: YB1/8MVAU-SS+SUMV91-SS) schematically shown in FIG. 6(a). Then, the application stability of the conductive coating material was evaluated.

In FIG. 6(a), Reference numeral 25 denotes a tank (container for coating material), Reference numeral 26 denotes a tube, Reference numeral 27 denotes a nozzle, Reference numeral 28 denotes a turntable, Reference numeral 29 denotes a stirrer, Reference numeral 30 denotes an air inlet tube, and Reference numeral 31 denotes a glass epoxy substrate. The tank 25 is a substantially cylindrical container having a capacity of 3L and is equipped with the stirrer 29 having a stirring blade, and a gas such as nitrogen is introduced through the gas inlet tube 30 to increase the pressure inside the tank 25. The tube 26 has a length of 3 m and an inner diameter of 4 mm, and the tank 25 and the nozzle 27 are interconnected. The tube 26 partly has a slack (26a), and the slack has a height difference (indicated by "t" in FIG. 6(a)) of 3 cm. The nozzle 27 has a length of 78 mm and a spray port diameter of 0.5 mm. The distance from the upper surface of the turntable 28 to the tip of the nozzle 27 is 8 cm.

As shown in FIG. 6(b), four pieces of polyimide tape 32 to 35 were attached to the corners of the glass epoxy substrate 31, and a piece of polyimide tape 36 was attached to the center of the glass epoxy substrate 31. The pieces of polyimide tape 32 to 36 each have an area of 1 cm×1 cm (the dimensions "a" and "b" in FIG. 6(b) are each 1 cm). The pieces of polyimide tape 32 to 35 are each attached 1 cm inside the corresponding side of the glass epoxy substrate 31 (the dimensions "c" and "d" in FIG. 6(b) are each 1 cm) and such that a side of each piece of tape is parallel to the corresponding side of the substrate.

The glass epoxy substrate 31 was placed at the center of the upper surface of the turntable 28. The horizontal distance (indicated by "s" in FIG. 6(a)) from the tip of the nozzle 27 to the glass epoxy substrate 31 was 25 cm. Next, 2 kg of the conductive coating material was introduced into the tank 25. Immediately thereafter, the conductive coating material was spray-applied under the following spray conditions while rotating the turntable 28 at 160 rpm and heated at 120° C. for 60 minutes to form a cured product of the conductive coating material having a thickness of 20 μm.

Separately, 20 minutes after the introduction of the conductive coating material into the tank 25, the conductive coating material was spray-applied under the same conditions as in the above and heated under the same conditions to form a cured product of the conductive coating material having a thickness of about 20 μm.

Hereinafter, the cured product of the conductive coating material formed immediately after the introduction of the conductive coating material into the tank 25 is referred to as "cured product A", and the cured product of the conductive coating material formed 20 minutes after the introduction of the conductive coating material into the tank 25 is referred to as "cured product B".

<Spray Conditions>
Liquid pressure: 0.1 MPa, pattern pressure: 0.07 MPa
Room temperature: 25° C., humidity: 60%
Duration of application: 8 seconds, the number of times of application: four times of reciprocation After completion of the heating, each test specimen was allowed to stand at room temperature for 30 minutes. The pieces of polyimide tape 32 to 36 were peeled off, and as shown in FIG. 6(c), the thickness of the glass epoxy substrate 31 at each portion where the pieces of tape were peeled off (indicated by arrow X) and the thickness of a portion (indicated by arrow Y) adjacen to the peeled portion, i.e., a portion where a cured product 41 of the conductive coating material was formed on the glass epoxy substrate 31, were measured with a micrometer. The former thickness value is subtracted from the latter thickness value so that the thickness of the cured product of the conductive coating material was determined. The thickness of the cured product of the conductive coating material was measured at the five portions of each test specimen.

The coating stability was evaluated from the thickness of the cured product A and the thickness of the cured product B. The evaluation was performed according to the following criteria. The evaluation results are shown in Tables 1 and 2.

Good: all of the five portions of the cured product A and the five portions of the cured product B have a thickness within the range of 20 μm±5 μm.

Poor: one or more portions of the cured product A and/or one or more portions of the cured product B have a thickness out of the range of 20 μm±5 μm.

(Cross-Cut Test)

The adhesion between the shielding layer and a surface of the package or the ground circuit was evaluated based on JIS K 5600-5-6:1999 (cross-cut method).

Specifically, a copper-clad laminate was prepared for evaluation of the adhesion with the ground circuit, and a molded resin was prepared for evaluation of the adhesion with a surface of the package. The laminate and the molded resin were each masked with polyimide tape to form an opening having a width of 5 cm and a length of 10 cm. The conductive coating material of each of the examples and comparative examples was spray-applied using a coater (Spray Cart III available from Spraying Systems Co., Japan, spray nozzle: YB1/8MVAU-SS+SUMV91-SS) schematically shown in FIG. 6(a). Thereafter, the conductive coating material was heated at 120° C. for 60 minutes to cure the conductive coating material. The polyimide tape was peeled to form a film having a thickness of about 20 μm. The films on the copper foil and the molded resin were subjected to a cross-cut test.

The adhesion was evaluated based on the following criteria.

Good: edges of cuts were completely smooth, and no grid square was peeled.

Poor: a film was slightly peeled off at an intersection of cuts, or a film was peeled off overall including an edge of a cut and an intersection of cuts.

(Evaluation of Storage Stability)

The viscosities of the conductive coating materials of the examples and comparative examples immediately after their production were measured with a BH-type viscometer (rotor No. 7, 10 rpm). Each viscosity measured was employed as an initial viscosity (V0).

Separately, the conductive coating materials of the examples and comparative examples were allowed to stand at room temperature for three days after their production, and then, the viscosities thereof were measured with a BH-type viscometer (rotor No. 7, 10 rpm). Each viscosity measured was employed as a viscosity (V3) after three-day standing.

The percentage (%) of change in viscosity was calculated from the following expression (3), and the storage stability of the conductive coating material was evaluated.

The evaluation was performed according to the following criteria. The results are shown in Tables 1 and 2.

$$\text{Percentage of change} = \{(V3-V0)/V0\} \times 100 \tag{3}$$

Good: percentage (%) of change was −20% to 20%.
Poor: percentage (%) of change was lower than −20% or higher than 20%.

As shown in Table 1, the conductive coating materials of Examples 1 to 10 had good results in the evaluation of curability, evaluation of specific resistance, evaluation of acetone rubbing resistance, evaluation of application stability, and a cross-cut test.

The conductive coating materials of Examples 1 to 8 containing an isocyanate curing agent as the curing agent (C) also had good results in the evaluation of storage stability.

As shown in Table 2, the conductive coating material of Comparative Example 1 free from the curing catalyst (E) did not sufficiently cure at a curing temperature of 120° C.

The conductive coating material of Comparative Example 1 also had a high specific resistance value in the evaluation of specific resistance, and the cured product thereof had insufficient conductivity.

The conductive coating material of Comparative Example 1 had a high peeling percentage of the cured product in the evaluation of acetone rubbing resistance and did not sufficiently cure.

The conductive coating materials of Comparative Examples 2 and 3 contained the curing catalyst (E), but the amount thereof was less than 0.5 parts by weight per 100 parts by weight of the binder component (A).

Thus, the conductive coating materials of Comparative Examples 2 and 3 had a high peeling percentage of the cured product in the evaluation of acetone rubbing resistance and did not sufficiently cure.

As shown in Table 2, the conductive coating materials of Comparative Examples 4 and 5 contained the curing catalyst (E), but the amount thereof was more than 5 parts by weight per 100 parts by weight of the binder component (A).

Thus, the conductive coating materials of Comparative Examples 4 and 5 had poor results in the evaluation of application stability and a cross-cut test.

As shown in Table 2, the conductive coating material of Comparative Example 6 contained the metal particles (B) in an amount of less than 500 parts by weight per 100 parts by weight of the binder component (A).

Thus, the conductive coating material of Comparative Example 6 had a high specific resistance value in the evaluation of specific resistance, and the cured product thereof had insufficient conductivity.

As shown in Table 2, the conductive coating material of Comparative Example 7 contained the metal particles (B) in an amount of more than 2500 parts by weight per 100 parts by weight of the binder component (A).

Thus, the conductive coating material of Comparative Example 7 had a high peeling percentage of the cured product in the evaluation of acetone rubbing resistance and did not sufficiently cure.

Further, the conductive coating material of Comparative Example 7 had poor results in the evaluation of application stability and a cross-cut test.

As shown in Table 2, the conductive coating material of Comparative Example 8 contained the curing agent (C), but the amount thereof was less than 1 part by weight per 100 parts by weight of the binder component (A).

Thus, the conductive coating material of Comparative Example 8 did not sufficiently cure at a curing temperature of 120° C.

The conductive coating material of Comparative Example 8 also had a high specific resistance value in the evaluation of specific resistance, and the cured product thereof had insufficient conductivity.

Further, the conductive coating material of Comparative Example 8 had a high peeling percentage of the cured product in the evaluation of acetone rubbing resistance and did not sufficiently cure.

Further, the conductive coating material of Comparative Example 8 had poor results in the evaluation of application stability.

As shown in Table 2, the conductive coating material of Comparative Example 9 contained the curing agent (C), but the amount thereof was more than 150 parts by weight per 100 parts by weight of the binder component (A).

Thus, the conductive coating material of Comparative Example 9 had a high specific resistance value in the evaluation of specific resistance, and the cured product thereof had insufficient conductivity.

Further, the conductive coating material of Comparative Example 9 had poor results in the evaluation of storage stability.

REFERENCE SIGNS LIST 1 substrate
2 electronic component
3 ground circuit pattern
4 sealing material
5 package
6 groove
7 conductive coating material
7a shielding layer
8 shield package
25 tank
26 tube
27 nozzle
28 turntable
29 stirrer
30 air inlet tube
31 glass epoxy substrate
32 to 36 polyimide tape
41 cured product of conductive coating material

TABLE 1

| Formulation | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Formulation | Binder component (A) | | 100 | 100 | 100 | 100 | 100 | 100 | 100 | 100 | 100 | 100 |
| | Metal particles (B) | | 1500 | 1500 | 1500 | 1500 | 1500 | 1500 | 500 | 2500 | 1500 | 1500 |
| | Curing agent (C) | Isocyanate curing agent | 50 | 50 | 50 | 50 | 50 | 50 | 50 | 50 | — | — |
| | | Imidazole curing agent | — | — | — | — | — | — | | | | |
| | | Radical curing agent | — | — | — | — | — | — | | | | |
| | Solvent (D) | | 500 | 500 | 500 | 500 | 500 | 500 | | | | |
| | Curing catalyst (E) | Fe-based curing catalyst | 3 | — | 0.5 | 5 | — | — | | | | |
| | | Zn-based curing catalyst | — | 3 | — | — | 0.5 | 5 | | | | |
| Evaluation | Evaluation of curability | | Good | Good | Good | Good | Good | Good | | | | |
| | Evaluation of specific resistance ($\times 10^{-5}$ $\Omega \cdot$ cm) | | 4.0 | 5.7 | 7.4 | 3.2 | 8.9 | 5.6 | | | | |
| | Evaluation of acetone rubbing resistance | | 5% | 12% | 14% | 1% | 11% | 18% | | | | |
| | Cross-cut test | | Good | Good | Good | Good | Good | Good | | | | |
| | Application stability | | Good | Good | Good | Good | Good | Good | | | | |
| | Storage stability | | Good | Good | Good | Good | Good | Good | | | | |

TABLE 1-continued

| | | | | | | |
|---|---|---|---|---|---|---|
| | agent (C) | Imidazole curing agent | — | — | — | — |
| | | Radical curing agent | — | — | — | 50 |
| | | Solvent (D) | 50 | 750 | 500 | 500 |
| | Curing catalyst (E) | Fe-based curing catalyst | 3 | 3 | 3 | 3 |
| | | Zn-based curing catalyst | — | — | — | — |
| Evaluation | | Evaluation of curability | Good | Good | Good | Good |
| | Evaluation of specific resistance ($\times 10^{-5}$ $\Omega \cdot$ cm) | | 9.7 | 2.8 | 7.7 | 6.7 |
| | Evaluation of acetone rubbing resistance | | 0% | 19% | 18% | 9% |
| | | Cross-cut test | Good | Good | Good | Good |
| | | Application stability | Good | Good | Good | Good |
| | | Storage stability | Good | Good | Poor | Poor |

TABLE 2

| | | | Comp Example 1 | Comp Example 2 | Comp Example 3 | Comp Example 4 | Comp Example 5 |
|---|---|---|---|---|---|---|---|
| Formulation | | Binder component (A) | 100 | 100 | 100 | 100 | 100 |
| | | Metel particles (B) | 1500 | 1500 | 1500 | 1500 | 1500 |
| | Curing agent (C) | Isocyanate curing agent | 50 | 50 | 50 | 50 | 50 |
| | | Imidazole curing agent | — | — | — | — | — |
| | | Radical curing agent | — | — | — | — | — |
| | | Solvent (D) | 500 | 500 | 500 | 500 | 500 |
| | Curing catalyst (E) | Fe-based curing catalyst | — | 0.3 | — | 8 | — |
| | | Zn-based curing catalyst | — | — | 0.3 | — | 8 |
| Evalutaion | | Evaluation of curability | Poor | Good | Good | Good | Good |
| | Evaluation of specific resistance ($\times 10^{-5}$ $\Omega \cdot$ cm) | | 11.2 | 8.8 | 12.5 | 3.5 | 6.7 |
| | Evaluation of acetone rubbing resistance | | 40% | 26% | 32% | 15% | 15% |
| | | Cross-cut test | Good | Good | Good | Poor | Poor |
| | | Application stability | Good | Good | Good | Poor | Poor |
| | | Storage stability | Good | Good | Good | Good | Good |

| | | | Comp Example 6 | Comp Example 7 | Comp Example 8 | Comp Example 9 |
|---|---|---|---|---|---|---|
| Formulation | | Binder component (A) | 100 | 100 | 100 | 100 |
| | | Metel particles (B) | 300 | 3000 | 1500 | 1500 |
| | Curing agent (C) | Isocyanate curing agent | 50 | 50 | 0.5 | 180 |
| | | Imidazole curing agent | — | — | — | — |
| | | Radical curing agent | — | — | — | — |
| | | Solvent (D) | 40 | 770 | 500 | 500 |
| | Curing catalyst (E) | Fe-based curing catalyst | 3 | 3 | 3 | 3 |
| | | Zn-based curing catalyst | — | — | — | — |
| Evalutaion | | Evaluation of curability | Good | Good | Poor | Good |
| | Evaluation of specific resistance ($\times 10^{-5}$ $\Omega \cdot$ cm) | | 131.0 | 3.0 | 32.0 | 14.0 |
| | Evaluation of acetone rubbing resistance | | 0% | 42% | 100% | 0% |
| | | Cross-cut test | Good | Poor | Poor | Good |
| | | Application stability | Good | Poor | Poor | Good |
| | | Storage stability | Good | Good | Good | Poor |

The invention claimed is:

1. A conductive coating material comprising:
  100 parts by weight of an epoxy resin-containing binder component (A);
  500 to 2500 parts by weight of metal particles (B);
  1 to 150 parts by weight of a curing agent (C);
  20 to 800 parts by weight of a solvent (D); and
  0.5 to 5 parts by weight of a curing catalyst (E), the curing catalyst (E) being an organic metal compound that is at least one selected from the group consisting of iron-2-ethylhexanoate, iron(III) acetylacetonate, zinc 2-ethylhexanoate, zinc naphthenate, and zinc(II) acetylacetonate.

2. The conductive coating material according to claim 1, wherein the metal particles (B) are at least one selected from the group consisting of silver powder, silver-coated copper powder, and silver-coated copper alloy powder.

3. The conductive coating material according to claim 1, wherein the curing agent (C) is an isocyanate curing agent.

4. The conductive coating material according to claim 1, wherein the conductive coating material is used for a shield package.

5. A method of producing a shield package that includes: a package containing electronic components mounted on a substrate and a sealing material sealing the electronic components; and a shielding layer covering the package, the method comprising:
  a package forming step of preparing the package containing electronic components sealed therein, including mounting the electronic components on the substrate, applying the sealing material to the substrate, and curing the sealing material;
  a conductive coating material applying step of applying the conductive coating material according to claim 1 to the substrate with the package formed thereon;
  a shielding layer forming step of forming the shielding layer, including heating the substrate with the conductive coating material applied thereto to cure the conductive coating material; and a cutting step of cutting the substrate so that the package is separated into individual pieces.

6. The method of producing a shield package according to claim 5, further comprising, after the package forming step, a package partitioning step of partitioning the package on the substrate with grooves, the step including forming the grooves by carving the sealing material between the electronic components, wherein in the cutting step, the substrate is cut along the grooves.

7. The method of producing a shield package according to claim 5, wherein the heating in the shielding layer forming step is performed at a temperature of 120° C. to 150° C.

* * * * *